United States Patent
Fan et al.

(10) Patent No.: US 7,713,583 B2
(45) Date of Patent: May 11, 2010

(54) METHOD FOR FORMING ISOTOPE-DOPED LIGHT ELEMENT NANOTUBE

(75) Inventors: Shou-Shan Fan, Beijing (CN); Liang Liu, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 718 days.

(21) Appl. No.: 11/118,588

(22) Filed: Apr. 29, 2005

(65) Prior Publication Data

US 2005/0191417 A1  Sep. 1, 2005

Related U.S. Application Data

(63) Continuation-in-part of application No. 10/402,701, filed on Mar. 28, 2003, now Pat. No. 7,029,751.

(30) Foreign Application Priority Data

Nov. 27, 2002 (CN) .................... 02 1 52098
May 20, 2004 (CN) .................. 2004 1 0027378

(51) Int. Cl.
*C23C 16/02* (2006.01)
*C23C 16/26* (2006.01)

(52) U.S. Cl. .............. 427/249.1; 427/255.21; 427/255.22; 427/255.23; 427/255.28

(58) Field of Classification Search ........... 427/215, 427/216, 249.1, 255.23, 255.21, 255.22, 427/255.28
See application file for complete search history.

(56) References Cited

U.S. PATENT DOCUMENTS

| | | | |
|---|---|---|---|
| 4,338,520 A | 7/1982 | Stewart | |
| 4,427,884 A | 1/1984 | Anbar et al. | |
| 4,900,830 A | 2/1990 | Fisher et al. | |
| 5,753,088 A | 5/1998 | Olk | |
| 5,773,834 A | 6/1998 | Yamamoto et al. | |
| 6,139,919 A * | 10/2000 | Eklund et al. | 427/430.1 |
| 6,183,714 B1 | 2/2001 | Smalley et al. | |
| 6,232,706 B1 | 5/2001 | Dai et al. | |
| 6,706,402 B2 * | 3/2004 | Rueckes et al. | 428/408 |
| 7,029,751 B2 * | 4/2006 | Fan et al. | 428/402 |

(Continued)

OTHER PUBLICATIONS

Zidan & Rao, "Doped Carbon Nanotubes for Hydrogen Storage", US DOE Hydrogen Program Review, 2002.*

(Continued)

*Primary Examiner*—H. (Holly) T Le
(74) *Attorney, Agent, or Firm*—D. Austin Bonderer

(57) ABSTRACT

An isotope-doped carbon nanotube (40) includes at least two kinds of carbon nanotube segments, each kind of carbon nanotube segment having a unique carbon isotope. The at least two kinds of carbon nanotube segments are arranged along a longitudinal direction of the carbon nanotube alternately or non-alternately. The carbon isotope is selected from the group consisting of a carbon-12 isotope, a carbon-13 isotope and a carbon-14 isotope. Three preferred methods employ different single isotope sources to form isotope-doped carbon nanotubes. In a chemical vapor deposition method, different isotope source gases are alternately or non-alternately introduced. In an arc discharge method, a power source is alternately or non-alternately switched between different isotope anodes. In a laser ablation method, a laser is alternately or non-alternately focused on different isotope targets.

8 Claims, 4 Drawing Sheets

U.S. PATENT DOCUMENTS

| | | | | |
|---|---|---|---|---|
| 7,479,325 | B2* | 1/2009 | Fan et al. | 428/403 |
| 2002/0127170 | A1* | 9/2002 | Hong et al. | 423/447.3 |
| 2004/0101685 | A1* | 5/2004 | Fan et al. | 428/403 |
| 2005/0276742 | A1* | 12/2005 | Fan et al. | 423/447.1 |
| 2006/0070868 | A1* | 4/2006 | Fan et al. | 204/173 |
| 2006/0257566 | A1* | 11/2006 | Fan et al. | 427/248.1 |
| 2008/0026168 | A1* | 1/2008 | Fan et al. | 428/34.1 |
| 2009/0252887 | A1* | 10/2009 | Barker et al. | 427/523 |

OTHER PUBLICATIONS

Fan et al., "Monitoring the growth of carbon nanotubes by carbon isotope labelling", Nanotechnology 14 (2003) 1118-1123.*

Maruyama et al. "Effect of Carbon Isotope Abundance on thermal conductivity and Raman scattering of single-walled carbon nanotubes", ISMME 2003-109 (Dec. 2003).*

Liu et al, Isotope Labeling of Carbon Nanotubes and Formation of 12C-13C Nanotube Junctions, J. Am. Chm. Soc. 2001, 123, 11502-11503.*

Fan et al, Monitoring the growth of carbon nanotubes by carbon isotope labelling, Nanotechnology 14 (2003) 1118-1123.*

Li, W.Z. et al., *Large-Scale Synthesis of Aligned Carbon Nanotubes*, Academic Research Library, Science, vol. 274, Dec. 6, 1996, pp. 1701-1703.

* cited by examiner

METHOD FOR FORMING ISOTOPE-DOPED LIGHT ELEMENT NANOTUBE

CROSS-REFERENCE TO RELATED APPLICATION

This application is a continuation-in-part application of U.S. patent application entitled "ISOTOPE-DOPED CARBON NANOTUBE AND METHOD AND APPARATUS FOR FORMING THE SAME," with application Ser. No. 10/402,701, filed on Mar. 28, 2003 now U.S. Pat. No. 7,029,751 and having the same assignee as the instant application.

TECHNICAL FIELD

This invention relates to nano-materials and methods and apparatuses for forming nano-materials, and more particularly to isotope-doped carbon nanotubes and a method and an apparatus for forming the same.

BACKGROUND

Carbon nanotubes were discovered by S. Ijima (Nature, vol. 354, pp. 56-58, 1991) and synthesized by T. W. Ebbesen and P. M. Ajayan (Nature, vol. 358, pp. 220-222, 1992). Theoretical studies showed that carbon nanotubes exhibit either metallic or semiconductive behavior depending on the radii and helicity of the tubules. Carbon nanotubes have interesting and potentially useful electrical and mechanical properties, and offer potential for use in electronic devices. Carbon nanotubes also feature high aspect ratios (>1000) and atomically sharp tips, which make them ideal candidates for electron field emitters, white light sources, lithium secondary batteries, hydrogen storage cells, transistors and cathode ray tubes (CRTs).

Carbon nanotubes are currently being produced by a variety of different techniques such as arc discharge (See S. Iijima et al, Nature, Helical Microtubules of Graphitic Carbon, vol. 354, pp. 56-58, 7 Nov. 1991), laser ablation (See T. W. Ebbesen and P. M. Ajayan, Large-scale Synthesis of Carbon Nanotubes, Nature, vol. 358, pp. 220-222, 16 Jul. 1992) and chemical vapor deposition (CVD) (See W. Z. Li et al., Large-scale Synthesis of Aligned Carbon Nanotubes, Science, vol. 274, pp. 1701-1703, Dec. 6, 1996). All of the above-mentioned disclosures are incorporated herein by reference.

Isotope labeling is a powerful tool in the study of nano-material growth mechanisms and in nano-sized isotope junction synthesis. Methods of isotope labeling use reactants containing different isotopes of a special element (usually light elements such as carbon, boron, nitrogen and oxygen), which are fed in designated concentrations (pure or mixed) and sequences into a nano-material synthesis process to provide in situ isotope labeling of nano-materials.

However, none of the three above-described techniques for producing carbon nanotubes, namely arc discharge, laser ablation and CVD, provides isotope-doped carbon nanotubes or a method for making isotope-doped carbon nanotubes. Therefore, what is needed is carbon nanotubes and methods for making the same.

SUMMARY

The present invention provides an isotope-doped carbon nanotube. In a preferred embodiment, the isotope-doped carbon nanotube includes at least two kinds of carbon nanotube segments, each kind of carbon nanotube segment including a unique carbon isotope. The at least two kinds of carbon nanotube segments are arranged along a longitudinal direction of the carbon nanotube alternately or non-alternately.

The carbon isotope of each kind of carbon nanotube segment is selected from the group consisting of a carbon-12 isotope, a carbon-13 isotope, and a carbon-14 isotope.

In another embodiment, three preferred methods for forming isotope-doped carbon nanotubes are provided. The first preferred method includes the steps of: providing a first and a second carbon source gases, each carbon source gas having a different single carbon isotope; providing a substrate having a catalyst film deposited thereon; introducing the first carbon source gas to form first carbon nanotube segments on the catalyst film by chemical vapor deposition; shutting off the first carbon source gas after a given time and introducing the second carbon source gas to form second carbon nanotube segments on the first carbon nanotube segments by chemical vapor deposition; and shutting off the second carbon source gas after a given time.

It is to be understood that part or all of any one or more of the above described steps may be repeated a desired number of times, whereby the isotope-doped carbon nanotubes include first carbon nanotube segments having a first carbon isotope and second carbon nanotube segments having a second carbon isotope, the first and second carbon nanotube segments being alternately or non-alternately arranged along a length of each isotope-doped carbon nanotube.

Alternatively, more than two carbon source gases which respectively include different single carbon isotopes can be provided, to obtain isotope-doped carbon nanotubes includes more than two kinds of carbon nanotube segments. The part or all of any one or more of the above described steps can be adjusted as needed, performed in a desired order, repeated in a desired order and repeated a desired number of cycles in respect of the carbon source gases to form isotope-doped carbon nanotubes having more than two kinds of carbon nanotube segments alternately or non-alternately arranged therein.

The second preferred method includes: providing a first and a second anodes respectively including a first and second carbon isotopes, providing a cathode positioned opposite to the anodes; creating an arc discharge between the first anode and the cathode to form a first carbon nanotube segments having the first carbon isotope on the cathode; and after a given time, switching to create an arc discharge between the second anode and the cathode to form second carbon nanotube segments having the second carbon isotope on the first carbon nanotube segments; whereby isotope-doped carbon nanotubes including the first and second isotopes are formed.

It is to be understood that part or all of any one or more of the above described steps may be repeated a desired number of times, whereby the isotope-doped carbon nanotubes include first carbon nanotube segments having a first carbon isotope and second carbon nanotube segments having a second carbon isotope, the first and second carbon nanotube segments being alternately or non-alternately arranged along a length of each isotope-doped carbon nanotube.

Alternatively, more than two anodes which respectively include different single carbon isotopes can be provided, to obtain isotope-doped carbon nanotubes including more than two kinds of carbon nanotube segments. Part or all of any or more of the above described steps can be adjusted as needed, performed in a desired order, repeated in a desired order and repeated a desired number of cycles in respect of the anodes to form isotope-doped carbon nanotubes having more than two kinds of carbon nanotube segments alternately or non-alternately arranged therein.

The third preferred method includes: providing a first and a second targets respectively including two different carbon isotope; providing a laser beam source positioned opposite to the carbon targets; irradiating the first target with a laser beam to form first carbon nanotube segments having a first carbon isotope on an accumulator; switching to irradiate the second target with the laser beam to form second carbon nanotube segments having a second carbon isotope on the first carbon nanotube segments.

It is to be understood that part or all of any one or more of the above described steps may be repeated a desired number of times, whereby the isotope-doped carbon nanotubes include first carbon nanotube segments having a first carbon isotope and second carbon nanotube segments having a second carbon isotope, the first and second carbon nanotube segments being alternately or non-alternately arranged along a length of each isotope-doped carbon nanotube.

Alternatively, more than two targets which respectively include different single carbon isotopes can be provided, to obtain isotope-doped carbon nanotubes including more than two kinds of carbon nanotube segments. Part or all of any or more of the above described steps can be adjusted as needed, performed in a desired order, repeated in a desired order and repeated a desired number of cycles in respect of the targets to form isotope-doped carbon nanotubes having more than two kinds of carbon nanotube segments alternately or non-alternately arranged therein.

Other advantages and novel features of the invention will become more apparent from the following detailed description of the preferred embodiments when taken in conjunction with the accompanying drawings, in which:

DETAILED DESCRIPTION OF THE INVENTION

The present invention is further described below and by reference to the figures.

Figure 1:
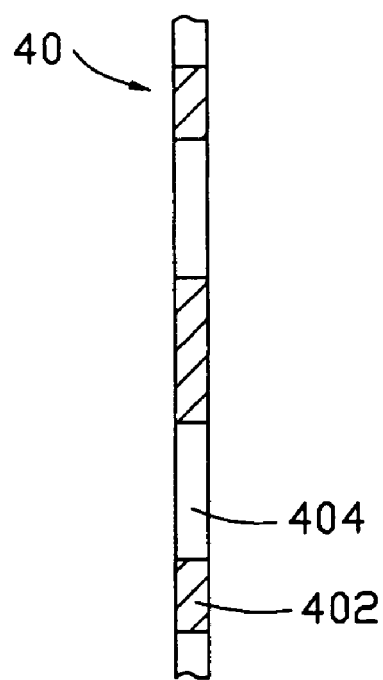
FIG. 1 is a schematic side, cross-sectional view of an isotope-doped carbon nanotube of a first embodiment of the present invention.

Referring to FIG. 1, an isotope-doped carbon nanotube 40 in accordance with a first embodiment of the present invention includes a plurality of first carbon nanotube segments 402 having a first carbon isotope and a plurality of second carbon nanotube segments 404 having a second carbon isotope. The first and second isotopes are selected from the group consisting of a carbon-12 isotope, a carbon-13 isotope and a carbon-14 isotope. The first and second carbon nanotube segments 402, 404 are arranged along a longitudinal direction of the carbon nanotube 40 alternately or non-alternately. In a preferred embodiment of the present invention, the carbon nanotube 40 has a length of 10~1000 μm and a diameter of 0.5~50 nm.

Figure 5:
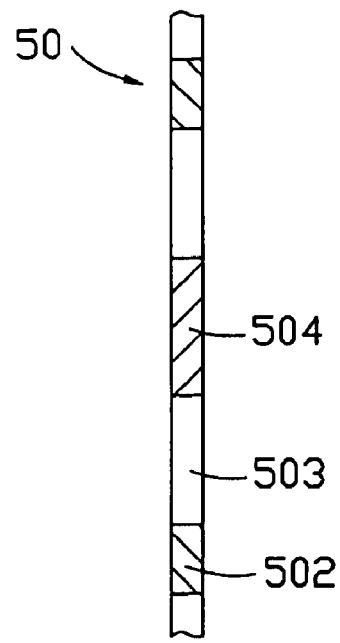
FIG. 5 is a schematic side, cross-sectional view of an isotope-doped carbon nanotube of a second embodiment of the present invention.

Referring to FIG. 5, an isotope-doped carbon nanotube 50 in accordance with a second embodiment of the present invention may include more than two kinds of carbon nanotube segments 502, 503 and 504, each carbon nanotube segment including a unique carbon isotope. The carbon isotope is selected from the group consisting of the carbon-12 isotope, the carbon-13 isotope and the carbon-14 isotope. The carbon nanotube segments 502, 503 and 504 are arranged along a longitudinal direction of the carbon nanotube 50 alternately or non-alternately. In a preferred embodiment of the present invention, the carbon nanotube 50 has a length of 10~1000 μm and a diameter of 0.5~50 nm.

Figure 2:
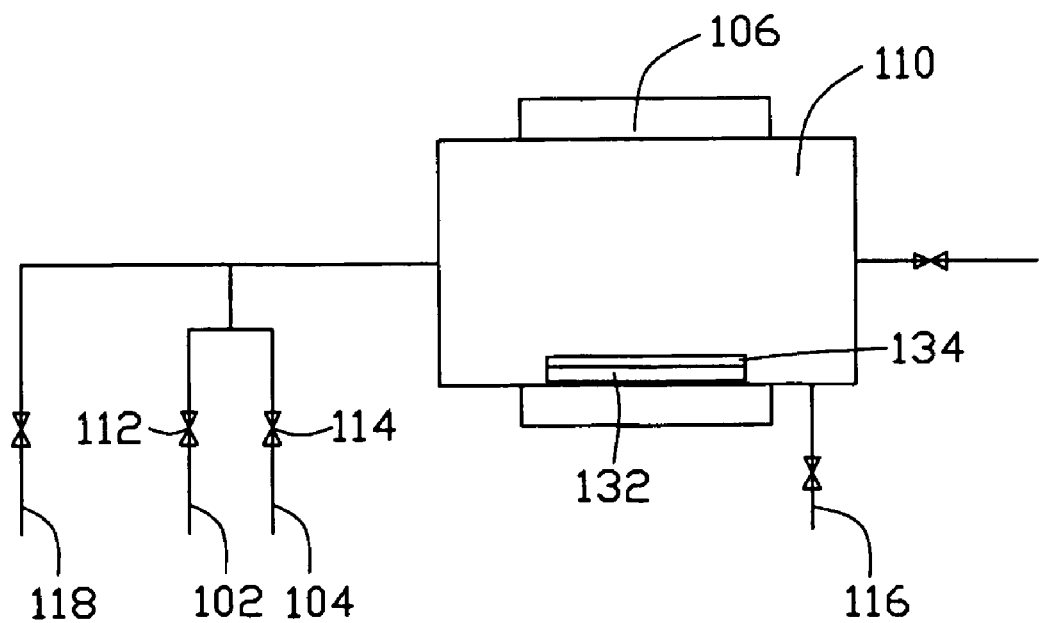
FIG. 2 is a schematic diagram of an apparatus used to form the isotope-doped carbon nanotubes of FIG. 1 in accordance with a first preferred method of the present invention.

A first preferred method of the present invention for forming a plurality of the carbon nanotubes 40 involves chemical vapor deposition. Referring to FIG. 2, said chemical vapor deposition method includes the following steps. By performing the following steps, isotope-doped carbon nanotubes each having only one first carbon nanotube segment 402 and only one second carbon nanotube segment 404 can be formed:

(1) providing two different ethylene gases respectively including carbon-12 isotopes and carbon-13 isotopes;

(2) putting a substrate 132 into a reaction chamber 110, the substrate 132 having an iron thin film 134 deposited thereon, the iron thin film 134 being 5 nm thick and functioning as a catalyst;

(3) creating a vacuum in the reaction chamber 110 via a gas exhaust conduit 116, introducing argon gas as a protecting gas at a pressure of 1 atmosphere into the reaction chamber 110 through a gas supply conduit 118, and heating the reaction chamber 110 up to 700° C. using a reaction furnace 106 disposed around the reaction chamber 110;

(4) opening a valve 112 and introducing ethylene gas having carbon-12 isotopes into the reaction chamber 110 through a gas supply pipe 102 at a flow rate of 120 sccm (standard cubic centimeters per minute), whereby first carbon nanotube segments (not shown) having carbon-12 isotopes are formed on the iron thin film 134;

(5) after a given time, when the first carbon nanotube segments having carbon-12 isotopes have reached a first desired length, closing the valve 112, and opening a valve 114 and introducing ethylene gas having carbon-13 isotopes into the reaction chamber 110 through a gas supply pipe 104 at a flow rate of 120 sccm, whereby second carbon nanotube segments (not shown) having carbon-13 isotopes are formed on said first carbon nanotube segments;

(6) after a given time, when the second carbon nanotube segments having carbon-13 isotopes have reached a second desired length, closing the valve 114 to stop the flow of ethylene gas having carbon-13 isotopes; and (7) cooling the reaction chamber 110 down to room temperature, thereby leaving isotope-doped carbon nanotubes formed on the substrate 132.

It is to be understood that after performing step (6), steps (4), (5) and (6) may be repeated in that order a desired number of cycles to form carbon nanotubes having carbon nanotube segments 402 and carbon nanotube segments 404 alternately arranged therein. Alternatively, after performing step (6), steps (4), (5) and (6) may be repeated in any desired order a desired number of cycles to form carbon nanotubes having carbon nanotube segments 402 and carbon nanotube segments 404 non-alternately arranged therein.

Figure 6:
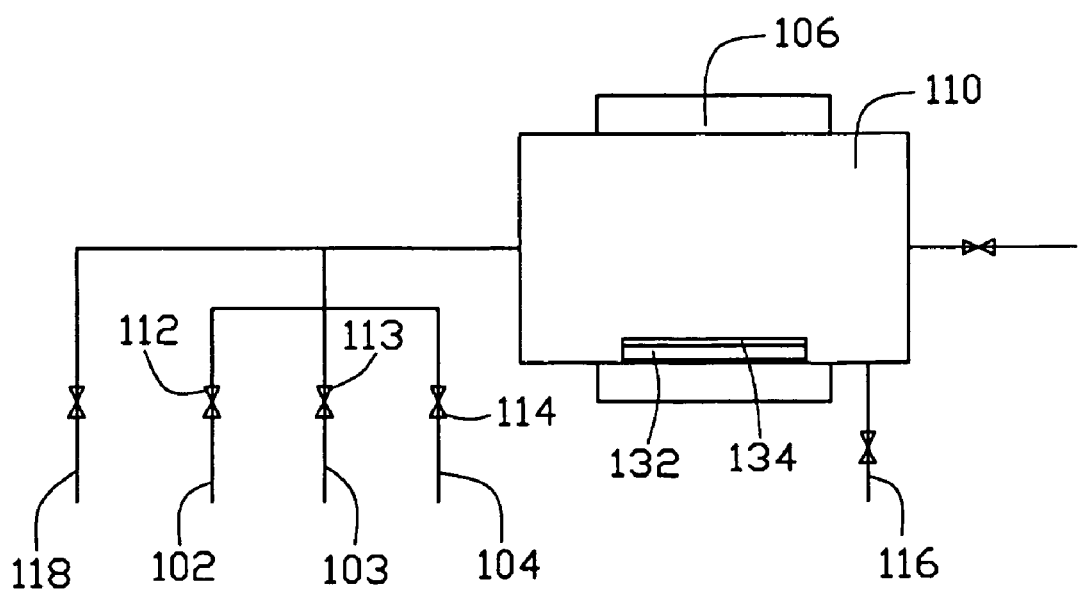
FIG. 6 is a schematic diagram of an apparatus used to form the isotope-doped carbon nanotubes of FIG. 5 in accordance with a first preferred method of the present invention.

Alternatively, more than two carbon source gases which respectively include different single carbon isotopes can be provided, to obtain isotope-doped carbon nanotubes including more than two kinds of carbon nanotube segments. For example, the carbon nanotube 50 which includes three carbon segments 502, 503 and 504, which respectively include different single carbon isotopes can be provided by chemical vapor deposition. Referring to FIG. 6, steps for forming the carbon nanotube 50 are similar with the steps of forming the carbon nanotube 40, except the steps (1), (4), (5) and (6) can be adjusted as needed. For example, step (1) is changed to providing three different ethylene gases respectively including carbon-12 isotope, carbon-13 isotope and carbon-14 isotopes. Thus, there are three gas supply pipes 102, 103, and 104 respectively via three valves 112, 113 and 114 for supplying different ethylene gases respectively including carbon-12, carbon-13 and carbon-14. Accordingly, the method includes an additional step of introducing ethylene gas having carbon-14 isotopes into the reaction chamber 110 by opening the valve 113 through the gas supply pipe 103 for forming a third segment having carbon-14 isotopes on the second carbon nanotube segment. It is to be understood that the additional step and steps (4), (5) and (6) can be performed in a desired order, repeated in a desired order, and repeated a desired number of cycles in respect of the carbon source gases to form isotope-doped carbon nanotubes having more than two kinds of carbon nanotube segments alternately or non-alternately arranged therein.

In alternative embodiments of the first preferred method, other metals such as cobalt, nickel or the like can be used as the catalyst instead of iron. Other carbon hydrogen compounds such as methane, ethyne or propadiene can be used as the carbon source gas instead of ethylene. Other gases such as helium, nitrogen or hydrogen can be used as the protecting gas instead of argon.

Figure 3:
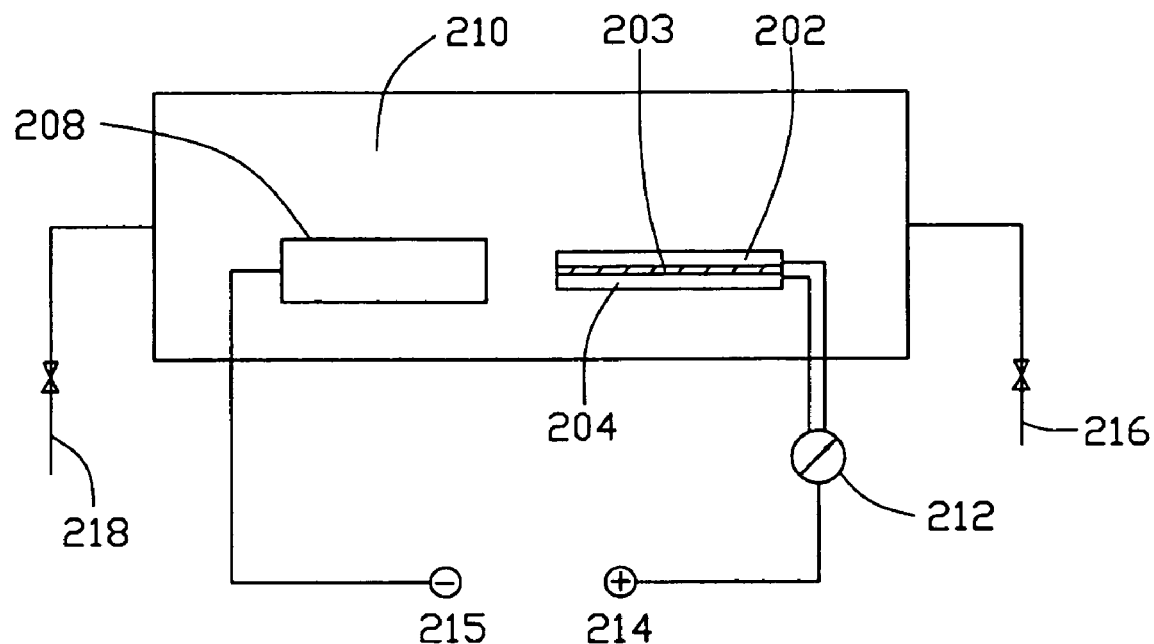
FIG. 3 is a schematic diagram of an apparatus used to form the isotope-doped carbon nanotubes of FIG. 1 in accordance with a second preferred method of the present invention.

A second preferred method of the present invention for forming a plurality of the isotope-doped carbon nanotubes 40 involves arc discharge. Referring to FIG. 3, said arc discharge method includes the following steps. By performing the following steps, isotope-doped carbon nanotubes each having only one first carbon nanotube segment 402 and only one second carbon nanotube segment 404 can be formed:

(1) providing a first carbon rod 202 including carbon-12 isotopes and having a diameter of 10 mm, the first carbon rod 202 being formed by pressing a composite powder and high purity graphite particles at a pressure of 3500 atmospheres, each particle having a diameter of 5 μm and being carbon-12 isotope graphite, the composite powder functioning as a catalyst and including nickel powder (0~13% by weight) and/or ytterbia powder (0~48% by weight), providing a second carbon rod 204 including carbon-13 isotopes and having a diameter of 10 mm, the second carbon rod 204 being formed in the same way with the same composite powder as the first carbon rod 202 is formed but using high purity graphite particles of carbon-13 isotopes, bonding the first and second carbon rods 202, 204 with an adhesive insulator 203 therebetween, and respectively connecting the first and second carbon rods 202, 204 to two load-side contacts of a switch 212, a supply-side contact of the switch 212 being connected to a positive terminal 214 of an electric arc discharge supply, the first and second carbon rods 202, 204 functioning in turn as an anode;

(2) connecting a pure graphite rod 208 to a negative terminal 215 of the electric arc discharge supply, the pure graphite rod 208 functioning as a cathode 208;

(3) placing the anodes 202, 204 adjacent the cathode 208 to create an arc gap of 1.5~2 mm, putting the anodes 202, 204 and cathode 208 into an arc discharge reaction chamber 210, creating a vacuum in the reaction chamber 210 via a gas exhaust conduit 216, and introducing helium gas as a protecting gas at a pressure of 100~500 torr into the reaction chamber 210 through a gas supply conduit 218;

(4) switching the switch 212 to connect the first carbon rod 202 with the positive terminal 214, and applying a discharge voltage of 20~40V and a discharge current of 100 A between the anode 202 and the cathode 208, whereby first carbon nanotube segments (not shown) having carbon-12 isotopes are formed on the cathode 208;

(5) after a given time, when the first carbon nanotube segments having carbon-12 isotopes have reached a first desired length, switching the switch 212 to disconnect the first carbon rod 202 while at the same time connecting the second carbon rod 204, and applying a discharge voltage of 20~40V and a discharge current of 100 A between the anode 204 and the cathode 208, whereby second carbon nanotube segments (not shown) having carbon-13 isotopes are formed on said first carbon nanotube segments; and (6) after a given time, when the second carbon nanotube segments having carbon-13 isotopes have reached a second length, switching off the electric arc discharge supply, thereby leaving isotope-doped carbon nanotubes formed on the cathode 208.

It is to be understood that after performing step (5), steps (4) and (5) may be repeated in that order a desired number of cycles to form carbon nanotubes having carbon nanotube segments 402 and carbon nanotube segments 404 alternately arranged therein. Alternatively, after performing step (5), steps (4) and (5) may be repeated in any desired order a desired number of cycles to form carbon nanotubes having carbon nanotube segments 402 and carbon nanotube segments 404 non-alternately arranged therein.

Figure 7:
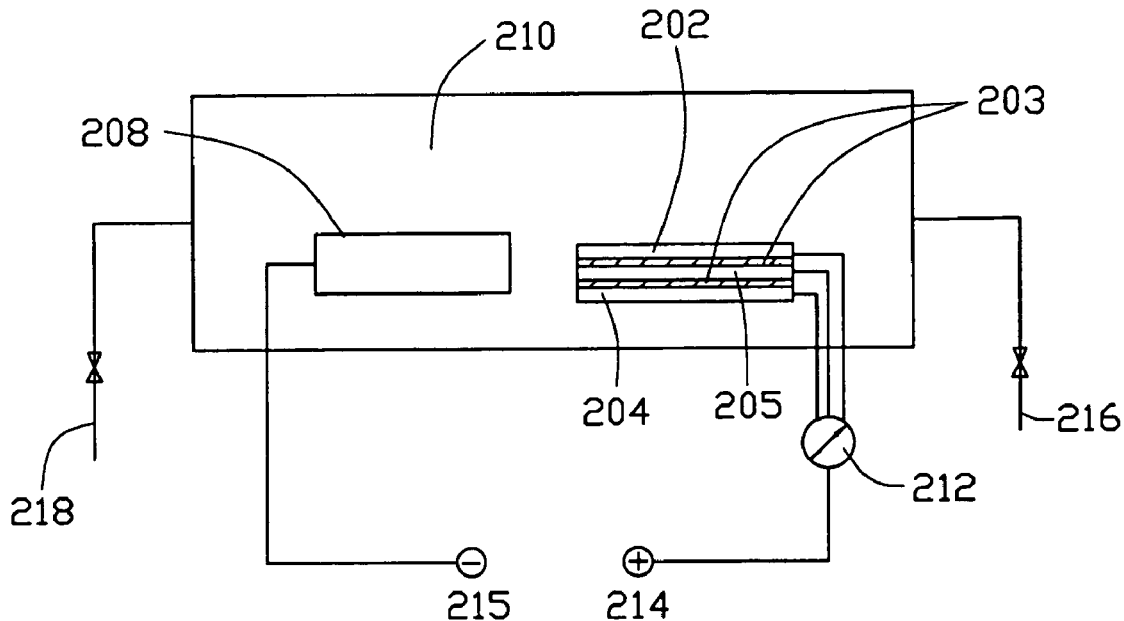
FIG. 7 is a schematic diagram of an apparatus used to form the isotope-doped carbon nanotubes of FIG. 5 in accordance with a second preferred method of the present invention.

Alternatively, more than two anodes which respectively include different single carbon isotopes can be provided, to obtain isotope-doped carbon nanotubes including more than two kinds of carbon nanotube segments. For example, the carbon nanotube 50 which includes three carbon segments 502, 503 and 504, which respectively include different single carbon isotopes can be provided. Referring to FIG. 7, steps for forming the carbon nanotube 50 are similar with the steps of forming the carbon nanotube 40, except the steps (1), (3), (4) and (5) can be adjusted as needed. For example, step (1) is adjusted to providing three carbon rods 202, 204 and 205 which respective include carbon-12 isotope, carbon-13 isotope and carbon-14 isotope with two adhesive insulators 203 to separating and bonding the three carbon rods 202, 204 and 205. Accordingly, the arc discharge method includes an additional step of switching to applying a discharge voltage and a discharge current between the carbon rod 205 and the cathode 208 for forming a third segment having carbon-14 isotopes on the second carbon nanotube segment. It is to be understood that the additional step and the steps (3), (4) and (5) can be performed in a desired order, repeated in a desired order, and repeated a desired number of cycles in respect of the anodes to form isotope-doped carbon nanotubes having more than two kinds of carbon nanotube segments alternately or non-alternately arranged therein.

In alternative embodiments of the second preferred method, other suitable materials such as pure cobalt powder, pure nickel powder or the like can be used as the catalyst and pressed with the graphite particles. Other gases such as argon, nitrogen or hydrogen can be used as the protecting gas instead of helium. Furthermore, a cooling pipe can be attached around the arc discharge reaction chamber 210 to avoid excessive build-up of heat therein.

Figure 4:
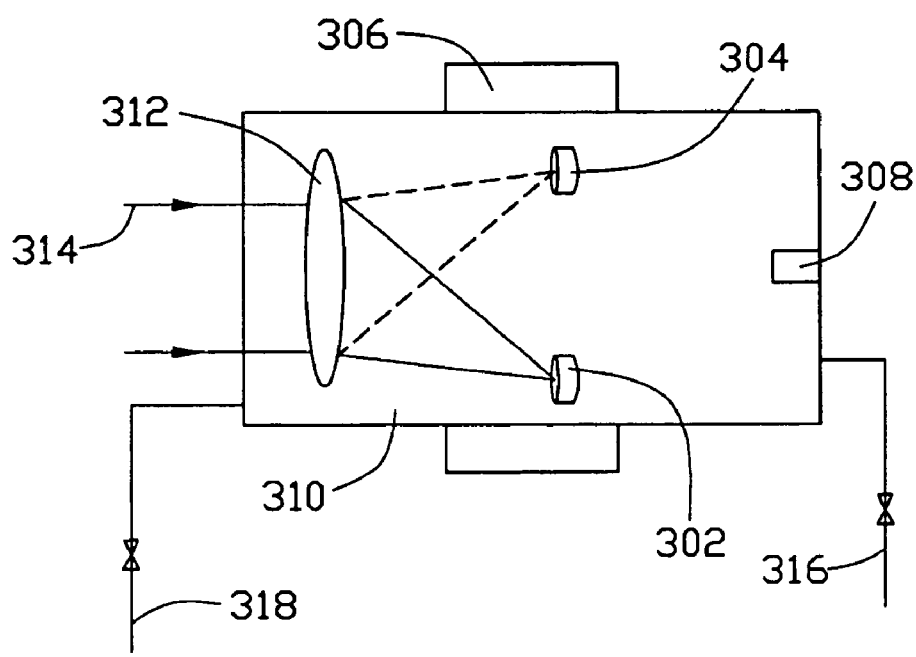
FIG. 4 is a schematic diagram of an apparatus used to form the isotope-doped carbon nanotubes of FIG. 1 in accordance with a third preferred method of the present invention.

A third preferred method of the present invention for forming a plurality of the isotope-doped carbon nanotubes 40 involves laser ablation. Referring to FIG. 4, said laser ablation method includes the following steps. By performing the following steps, isotope-doped carbon nanotubes each having only one first carbon nanotube segment 402 and only one second carbon nanotube segment 404 can be formed:

(1) providing a first carbon target 302 including carbon-12 isotopes, the first carbon target 302 being formed by pressing a composite powder together with a high purity graphite powder of carbon-12 isotopes, the composite powder functioning as a catalyst and including cobalt powder (2.8% by weight) and nickel powder (2.8% by weight), and providing a second carbon target 304 including carbon-13 isotopes, the second carbon target 304 being formed in the same way with the same composite powder as the first carbon target 302 is formed but using high purity graphite powder of carbon-13 isotopes;

(2) providing a carbon nanotube accumulator 308;

(3) putting the first and second targets 302, 304 and the accumulator 308 into a laser ablation reaction chamber 310, with the accumulator 308 being placed behind the first and second targets 302, 304;

(4) creating a vacuum in the reaction chamber 310 via a gas exhaust conduit 316, and introducing argon gas as a protecting gas at a pressure of 50~760 torr into the reaction chamber 310 through a gas supply conduit 318;

(5) heating a region in the vicinity of the first and second targets 302, 304 up to 1000~1200° C. using a heater 306;

(6) focusing a pulsing laser beam 314 of a laser (not shown) on the first target 302 using a lens 312 located in front of the first and second targets 302, 304, the pulsing laser beam 314 having a wavelength of 532 nm and a single pulsing energy of 250 mJ, a diameter of a spot of irradiation on the first target 302 being 5 mm, whereby first carbon nanotube segments (not shown) having carbon-12 isotopes are formed on the accumulator 308;

(7) after a given time, when the first carbon nanotube segments having carbon-12 isotopes have reached a first length, switching the lens 312 to focus the laser beam 314 on the second target 304, whereby second carbon nanotube segments (not shown) having carbon-13 isotopes are formed on said first carbon nanotube segments; and (8) after a given time, when the second carbon nanotube segments having carbon-13 isotopes have reached a second length, switching off the pulsing laser beam 314, thereby leaving isotope-doped carbon nanotubes formed on the accumulator 308.

It is to be understood that after performing step (7), steps (6) and (7) may be repeated in that order a desired number of cycles to form carbon nanotubes having carbon nanotube segments 402 and carbon nanotube segments 404 alternately arranged therein. Steps (1), (6) and (7) can be adjusted as needed, performed in a desired order, repeated in a desired order, and repeated a desired number of cycles in respect of the carbon source gases to form isotope-doped carbon nanotubes having more than two kinds of carbon nanotube segments alternately or non-alternately arranged therein.

Figure 8:
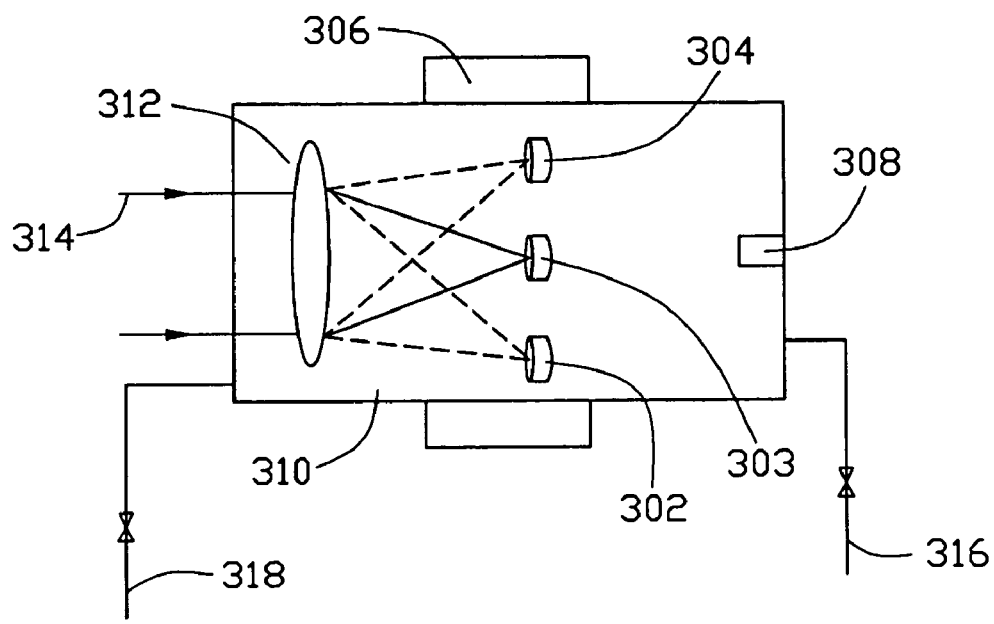
FIG. 8 is a schematic diagram of an apparatus used to form the isotope-doped carbon nanotubes of FIG. 5 in accordance with a third preferred method of the present invention.

Alternatively, more than two targets which respectively include different single carbon isotopes can be provided, to obtain isotope-doped carbon nanotubes including more than two kinds of carbon nanotube segments. For example, the carbon nanotube 50 which includes three carbon segments 502, 503 and 504, which respectively include different single carbon isotopes can be provided. Referring to FIG. 8, steps for forming the carbon nanotube 50 are similar with the steps of forming the carbon nanotube 40, except the steps (1), (3), (5), (6) and (7) can be adjusted as needed. For example, step (1) is changed to providing three carbon targets 302, 303 and 304 respectively including carbon-12 isotope, carbon-13 isotope and carbon-14 isotope. Accordingly, the laser ablation method includes an additional step of focusing the pulsing laser beam 314 on the third target 303 for forming a third segment having carbon-14 isotope on the second carbon nanotube segment. It is to be understood that the additional step and the steps (3), (5), (6) and (7) can be performed in a desired order, and repeated a desired number of cycles in respect of the targets to form isotope-doped carbon nanotubes having more than two kinds of carbon nanotube segments alternately or non-alternately arranged therein.

In alternative embodiments of the third preferred method, other suitable materials such as pure cobalt powder, pure nickel powder or the like can be used as the catalyst and pressed with the graphite powder. Other gases such as helium, nitrogen or hydrogen can be used as the protecting gas instead of argon. In addition, the laser beam may be focused on the respective first and second targets 302, 304 by mounting the first and second targets 302, 304 on a rotatable member, and rotating the rotatable member to exchange locations of the first and second targets 302, 304.

The preferred methods of the present invention can form multiple isotope-doped carbon nanotubes 40, each including the first carbon nanotube segments 402 having a first isotope and the second carbon nanotube segments 404 having a second isotope. The first and second carbon nanotube segments 402, 404 are arranged along the longitudinal direction of the carbon nanotube 40 alternately or non-alternately. Alternatively, the preferred methods of the present invention can form multiple isotope-doped carbon nanotubes, each including at least two kinds of carbon nanotube segments, each kind of carbon nanotube segment including a unique carbon isotope. The at least two kind of carbon nanotube segments are arranged along a longitudinal direction of the carbon nanotube alternately or non-alternately.

Accordingly, the growth pattern of different carbon isotopes can be recorded in situ by micro-Raman spectroscopy. Further, the growth mechanisms of carbon nanotubes can be investigated in this way. In a preferred embodiment, the isotope-doped carbon nanotube 40 is grown at 690° C. for 8 minutes. The carbon sources having different carbon isotopes have different feeding periods for make it easy to discern which period does a particular isotope composition belong to. In this embodiment, the ethylene having carbon-12 isotope has a feeding periods from 15 seconds to 45 seconds and is interlaced by 15 seconds of feeding periods of the ethylene having carbon-13 isotope. Raman spectra can be collected on freshly cleaved side faces of the isotope-doped carbon nanotube 40, from the top of the carbon nanotube 40 to the bottom end, to get a curve. The turning points in the curve can be related with switching times. Thus, the positions and the times are related with each other to draw a graph of position vs. time, showing the growth process of the isotope-doped carbon nanotube 40 from start to end. The growth rate of the carbon nanotube 40 can be calculated. In this embodiment, the carbon nanotube grows with a nearly constant growth rate throughout the most of its length and the growth is 0.36 micrometers per second at 690° C.

Moreover, the preferred methods can be employed to form one-dimensional nano-materials containing isotopes other than those of pure carbon; for example, isotopes of light element compositions including boron, nitrogen or oxygen. Examples are carbon nanotubes, boron nitride nanotubes, gallium nitride (GaN) nanowires, zinc oxide (ZnO) nanowires, etc.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A method for forming isotope-doped carbon nanotubes, the method comprising:
   (a) supplying at least two different carbon source gases with different isotopes of carbon, at least one of the carbon source gases comprises of carbon-14;
   (b) putting a substrate in a reaction chamber, the substrate having a catalyst film deposited thereon;
   (c) creating a vacuum in the reaction chamber;
   (d) introducing a protecting gas into the reaction chamber, and heating the reaction chamber to a predetermined temperature; and
   (e) alternately introducing the at least two different carbon source gases into the reaction chamber at a predetermined flow rate to form the carbon nanotubes each having at least two carbon nanotube segments arranged therein, at least one of the segments comprises of carbon-14.

2. The method as claimed in claim 1, wherein the carbon source gases is selected from the group consisting of ethylene, methane, ethane, and propadiene.

3. The method as claimed in claim 1, wherein a length of the isotope-doped carbon nanotube is in the range from about 10 to about 1000 micrometers.

4. The method as claimed in claim 1, wherein a diameter of the isotope-doped carbon nanotube is in the range from about 0.5 to about 50 nanometers.

5. The method as claimed in claim 1, wherein the catalyst comprise of a material selected from the group consisting of iron, cobalt, and nickel.

6. The method as claimed in claim 1, wherein the reaction chamber is heated to about 700° C.

7. The method as claimed in claim 1, wherein at least one of the predetermined flow rates is about 120 sccm.

8. The method as claimed in claim 1, wherein the protecting gas comprises of a gas selected from the group consisting of helium, nitrogen and argon.

\* \* \* \* \*